(12) United States Patent
Zhang et al.

(10) Patent No.: US 10,989,750 B1
(45) Date of Patent: Apr. 27, 2021

(54) SYSTEM FOR LOCATING FAULT IN POWER DISTRIBUTION NETWORK BASED ON MIXED MODE WAVE RECORDING

(71) Applicant: INHAND NETWORKS Inc., Fairfax, VA (US)

(72) Inventors: Jianliang Zhang, Beijing (CN); Qiang Yao, Beijing (CN); Yibo Dai, Beijing (CN)

(73) Assignee: InHand Networks Inc., Fairfax, VA (US)

( * ) Notice: Subject to any disclaimer, the term of this patent is extended or adjusted under 35 U.S.C. 154(b) by 0 days.

(21) Appl. No.: 16/319,279

(22) PCT Filed: May 7, 2018

(86) PCT No.: PCT/US2018/031457
§ 371 (c)(1),
(2) Date: Jan. 18, 2019

(87) PCT Pub. No.: WO2019/216878
PCT Pub. Date: Nov. 14, 2019

(51) Int. Cl.
*G01R 31/08* (2020.01)
*G06N 3/04* (2006.01)
*G05B 23/02* (2006.01)

(52) U.S. Cl.
CPC ......... *G01R 31/086* (2013.01); *G05B 23/024* (2013.01); *G06N 3/04* (2013.01)

(58) Field of Classification Search
CPC ....... G01R 31/086; G06N 3/04; G05B 23/024
See application file for complete search history.

(56) References Cited

U.S. PATENT DOCUMENTS

| 10,324,132 | B2 * | 6/2019 | Saarinen | G01R 31/3274 |
| 2017/0243113 | A1 * | 8/2017 | Fukuda | G06N 3/0454 |
| 2019/0170801 | A1 * | 6/2019 | Pong | G01R 31/50 |

OTHER PUBLICATIONS

Guo et al. (Deep-Learning-Based Earth Fault Detection Using Continuous Wavelet Transform and Convolutional Neural Network in Resonant Grounding Distribution Systems, Feb. 1, 2018, IEEE) (Year: 2018).*
Bhattacharya (Intelligent Fault Analysis in Electrical Power Grids, 2017) (Year: 2017).*
Lee, Automatic Power Quality Monitoring with Recurrent Neural Network (Year: 2016).*

* cited by examiner

*Primary Examiner* — Mohammad K Islam
(74) *Attorney, Agent, or Firm* — John Ye

(57) ABSTRACT

The present disclosure relates to the field of power technology, and in particular to a system for locating fault in power distribution network based on mixed mode wave recording.

8 Claims, 10 Drawing Sheets

SYSTEM FOR LOCATING FAULT IN POWER DISTRIBUTION NETWORK BASED ON MIXED MODE WAVE RECORDING

BACKGROUND OF THE DISCLOSURE

The present application is a national stage application for PCT/US18/31457, filed on 7 May 2018, and received a favorable search report from USPTO on 12 Jul. 2018. Power distribution network is an important part of power system. But with the rapid evolvement to smart grid, there are large numbers of dispersed power source connected intermittently. This makes the distribution network fault communication more complicated, and causes more difficulties in accurate and rapid fault diagnosis.

In order to protect the distribution network working properly in high degree of intelligence, it is necessary to monitor the feeder lines operation data in real time, and to timely alert and troubleshoot abnormal situations, as well as quickly locating and dealing them. Therefore, the distribution network usually is installed with devices such as line fault indicators and feeder terminals, and these devices are used to record wave information in the operation of the distribution network.

At the present technology level, the methods for fault location usually need to manually extract the recorded wave features, and then use the features to identify and locate the ground fault. As disclosed in CN103728532, a zero-sequence voltage 3U0 and a zero-sequence current 3I0 are collected by using a distribution automation feeder terminal, and a series of processes are performed on 3U0 and 3I0 to extract the characteristics. Then, fault determination rules set by prior experience are combined with multiple distributed and automated feeder terminals to locate faulty section. CN104101812 also discloses a fault detection and location method and system for a small current grounded distribution network. In that case, the system master unit extracts the transient signals of zero-sequence voltage and zero-sequence current from the recorded waves at a plurality of locations in the distribution network. Then the similarity characteristics of each location waveform are calculated. Finally, based on the location specific characteristics and similarity characteristics to determine the suspected fault location.

It can be seen from the above that various fault location methods in the prior art still divide the waveform feature extraction and fault location determination into two steps. Therefore, the multi-position original waveform in the distribution network obtained through the terminal device in the power distribution network still needs to be artificially extracted to get to the characteristics, before the characteristics can be used to locate the fault.

This kind of fault location determination process does not achieve a non-end-to-end solution utilizing direct feedback. Therefore, the accuracy of fault location identification cannot be continuously improved. On the other hand, in applying existing machine learning model to the problem, because the model processing capacity is limited, therefore, diagnostic waveforms spanning over long period that can be used to detect fault progression or intermittent fault are not applicable—only the truncated wavelet segments are utilized. When giving wavelets as input to the machine learning model, no matter how the original waveform is truncated, the result will nonetheless be of loss of valuable information.

DETAILED DESCRIPTION OF THE DISCLOSURE

Figure 1:
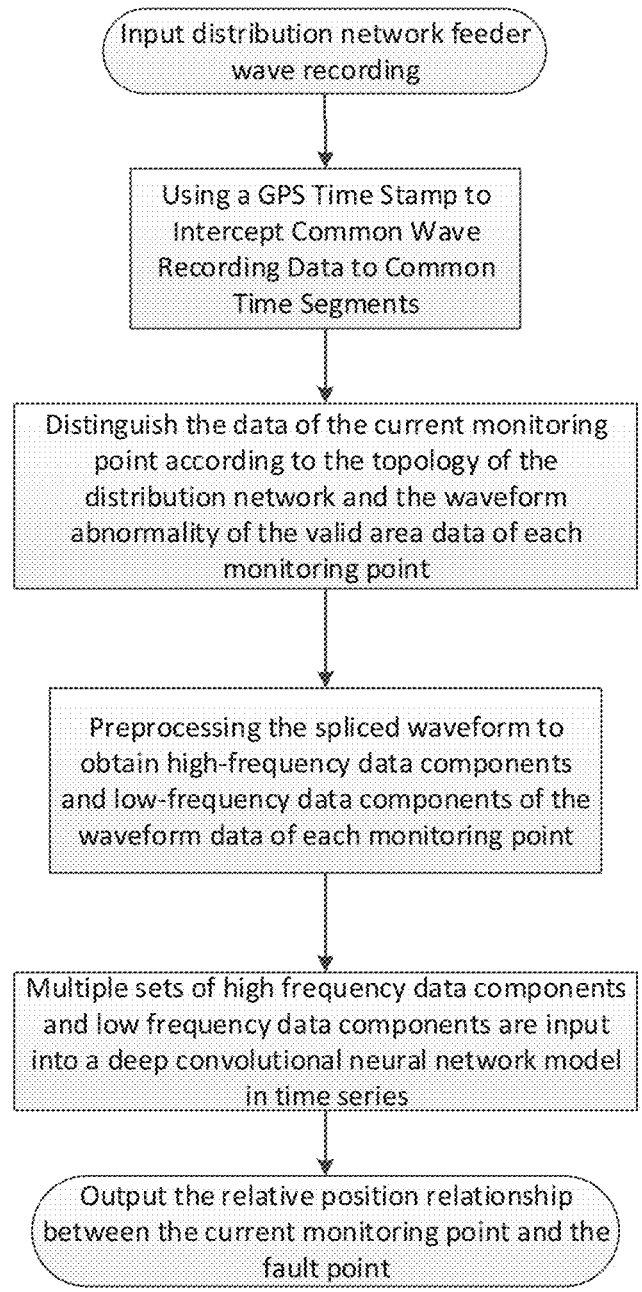
FIG. 1 is a schematic flow chart of a method for fault location of a distribution network based on mixed recording waves according to the present invention.

The technical problem to be solved by the present disclosure is through constructing a multi-channel deep neural network related to the timing, and achieving the saving of the valuable information of the long span waveform used for detecting the fault progression or the intermittent fault, so as to improve the fault location recognition accuracy.

In order to achieve the above technical solution, the present disclosure provides a system for fault location of a distribution network based on mixed mode waveform recording, configured to: determine common data segment for each monitoring point based on a wide area synchronization technology; based on the common data segment, sequentially piece together the data over the monitoring points as synchronized data; preprocess the synchronized data from each monitoring point into high frequency component sequence and low frequency component sequence; construct deep neural network model to include the multi-convolution layer and the long and short memory network unit groups of data block input, and further through machine training to obtain plurality of data block input deep neural network models, choose an optimal model; thereafter, feed into this optimal model data from the monitoring points, which includes the high frequency component sequence and the low frequency component sequence, in order to obtain the relative position relationship between each monitoring point and the fault point.

The following embodiment should be read together with the drawing to provide context and details. But one should note that the following embodiment should not be read in isolation in terms of the described characteristics or technical combination. One can rearrange the technical combination in order to achieve better results. When the following embodiment refers to a similar identification of a component or characteristic, they are equally applicable in other embodiments.

In one embodiment, the said multi-component data block input deep neural network model contains high frequency and low frequency data block input, where the high frequency data block is input into multi-layer network Module I, and the low frequency data block is input into multi-layer network Module II.

In another embodiment, the said multi-layer network Module I includes multi-convolution layers and full connection layer between convolutions layers. Such configuration will have the same counterparts for Module II.

In another embodiment, the multi-layer network Module I includes multi-convolution layers, convolution block, average pooling layer, and and full connection layer between convolutions layers.

In another embodiment, the multi-layer network Module I output is superimposed with the output from the multi-layer network Module II based on weight factor, before being input into a shared Long and Short Term Memory (LSTM) cell, where the timing sequence is used to connect between multiple LSTM cells through multiple computation channels.

In the following, the waveform preprocessing and waveform splicing, the deep neural network location identification model and hyper-parameter machine training of the present disclosure are further explained.

Waveform Preprocessing and Waveform Splicing

FIG. 1 is a flow chart of a method for fault location of a distribution network based on mixed recording waves according to the present disclosure. The waveform splicing refers to a common section that aligns and cuts out waveforms according to a wide area time synchronization technique at points of time in the collection of data at each monitoring point. Then, according to the network topology of different distribution network monitoring points, they are spliced in sequence to form a complete synchronization data for each monitoring point.

The sequential splicing means that, for example, the data splicing for the monitoring point A is: taking the effective area data of the monitoring point A as a center, according to the topology structure of the distribution network, extracting the closest monitoring point A− for input and the closest output direction of the monitoring point A+. The effective area data of the monitoring point A− and the monitoring point A+ are stitched as two ends of the effective area data concerning the monitoring point A according to the input and output directions. For other monitoring points within the effective area, such as other monitoring points on the AA− side, the extracted data sequence can show relationship to the A− effective area according to the degree of waveform anomaly. The higher the degree of waveform anomaly is, the closer the monitoring point A− data being the effective area data. Similarly, at other monitoring points on the AA+ side, the effective area data sequence is related to how close proximity to the monitoring point A+ being in the effective area, according to the degree of waveform anomaly. The higher degree of the waveform anomaly, the closer the measurement point A+ being in the effective area.

Waveform preprocessing includes two steps. In the first step, a plurality of effective waveform segments is extracted from the spliced waveforms to extract a plurality of high-frequency component regions that do not include the power frequency from the synchronized data of each monitoring point. In the second step, the interval region between the high-frequency component regions is down-sampled or interpolated to obtain a low-frequency component region.

In the first effective waveform extraction operation, the effective waveform section is defined as an abnormal section in the current or electromagnetic field that includes frequency components other than the operating frequency. By extracting the abnormal section, a plurality of effective waveform sections can be obtained. The number of waveform sections corresponds to the number of abnormal sections. Three methods for extracting the waveform segments that can be used in the present disclosure are specifically identified as secondary differential method, sliding window Fourier transform method, and wavelet transform method.

The secondary differential method is based on $N(t)=\{n_1, n_2, \ldots, n_k\}$ being the original waveform timing signal, first differential being $N'(t)=\{n_2-n_1, n_3-n_2, \ldots, n_k-n_{k-1}\}$ and second differential being $N''(t)=\{n_3-2n_2+n_1, n_4-2n_3+n_2, \ldots, n_k-2n_{k-1}+n_{K-2}\}$.

The sliding window Fourier transform is to slide the entire waveform by the length of one window, and each time the data in the window is subjected to discrete Fourier transform. The Fourier transform is defined as $$(k) = \sum_{i=1}^{N-1} x(i)e^{\frac{-j2pi}{N}},$$

where x(i) is the coefficient of each frequency point. Using Fourier entropy, it is possible to detect the degree of chaos in the distribution of energy in different frequency bands in each period of the waveform window. Defining the energy of different frequencies in the window as $E_i=|x(i)|^2$, and $E=\Sigma E_i$ as the sum of energy of the signals in the window. Then the window Fourier energy entropy FEE can be defined as $FEE=-\Sigma_{i=1}^{J-1} p_i \ln(p_k)$, where $p_i=E_i/E$.

The wavelet transform refers to $N(k)=\Sigma_{i=0}^{J+1} D_i(k)$, where $D_i(k)$ is the i-th order frequency coefficient obtained by the J-order wavelet decomposition and reconstruction of the signal. The wavelet energy entropy is used to detect the degree of chaos in the distribution of signal energy in different frequency bands in each period of the waveform, so as to achieve the purpose of extracting the abnormal section. Defining the energy spectrum of the signal at different scale of i and timing of k as $E_i(k)=|D_i(k)|^2$, and $E=\Sigma E_i$ as the sum of energy at all times at scale i, then the wavelet energy entropy WEE can be defined as $WEE=-\Sigma_{i=1}^{J+1} p_i \ln(p_k)$, where $p_i=E_i/E$, and $E=\Sigma_{i=1}^{J+1} E_i$ is approximately the total energy of the signal.

In the above three different waveform extraction methods, the waveform's second-order differential absolute value can be used to identify well the abrupt point of the waveform. This method has a small amount of calculation and can save computing resources. Therefore it can be used when the computing resources are limited. But this method cannot retain the richness of waveforms information contained in the different frequency. Using the window Fourier energy entropy can well eliminate the power frequency components, and get the chaos of other different frequency bands. However, the window size needs to be fixed, and the chaotic information of each time cannot be flexibly obtained. At the same time, the calculation amount of its fast algorithm is relatively small. Therefore, it can be used when the accuracy and the amount of calculation need to be balanced. Wavelet energy entropy has higher accuracy than window Fourier energy entropy in the section required for detection, but the amount of calculation is also large, and it can be used in high accuracy requirements.

In the present disclosure, a cubic spline interpolation method can be used to perform down-sampling processing or interpolation processing to capture waveform segment.

Through the above processing method, a plurality of sets of data combinations including high-frequency components and low-frequency components arranged in time sequence can be obtained.

Deep Neural Network Location and Recognition Model

Figure 2:
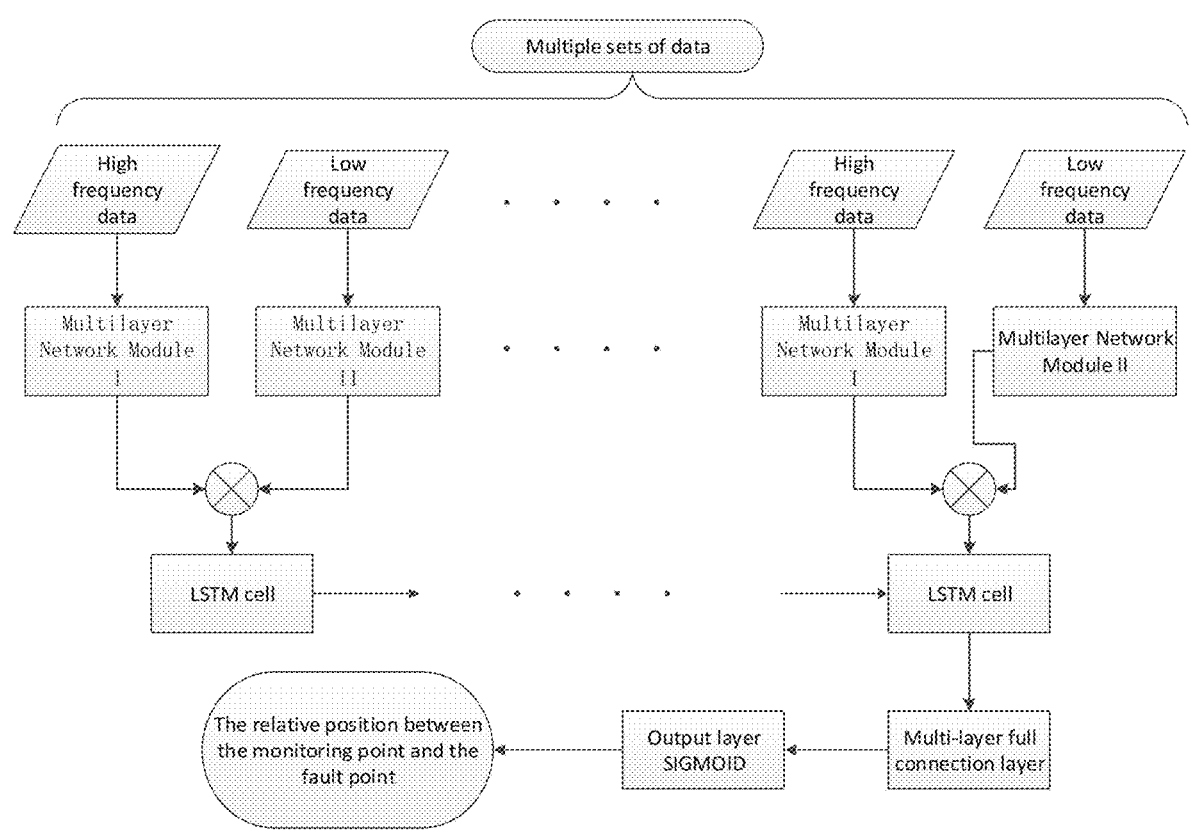
FIG. 2 is a deep neural network location and recognition model of the present invention.

The deep neural network location recognition model of the present disclosure is shown in FIG. 2. The deep neural network location and identification model has a plurality of computation channels. Each computation channel inputs a set of high frequency components and low frequency component data, where the high frequency component data is input to the multi-layer network module I, and the low frequency component data is input to the multi-layer network module II. The output result of the multi-layer network module I and the output result of the multi-layer network module II are superimposed on the LSTM cell with the input-shared weight, and the LSTM cells are connected one after the other in a plurality of LSTM cells in the plurality of operation channels. The output is directed to the fully connected layer area, then the type of the working condition is further output through the sigmoid output layer. The multi-layer network module I, the multi-layer network module II, and the LSTM cell in all computation channels are the same.

Figure 3:
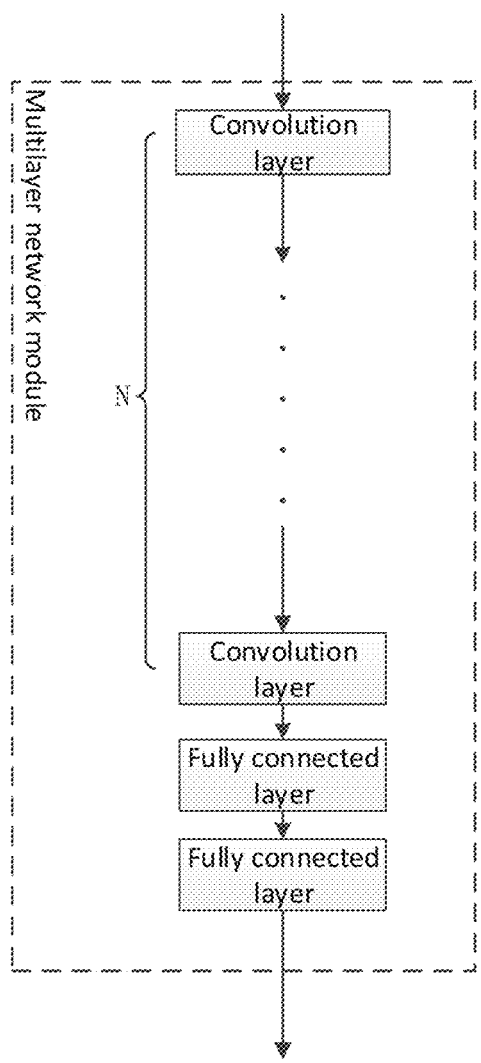
FIG. 3 is a schematic structural diagram of a multi-layer network module I and II according to an embodiment of the present invention.

FIG. 3 is a schematic structural diagram of a multi-layer network module I and II according to the present invention. In an embodiment of the present invention, the multi-layer network modules I and II have the same structure, each of which includes multiple convolution layers and two fully connected layers. The convolution operation involved in the convolution layer in the present invention employs a convolution operation method known in the prior art. But the number of convolution layers in the multilayer network module of the present invention, the convolution kernel and related parameters are determined by model training method of the present invention to obtain an optimized deep neural network location identification model.

Figure 4:
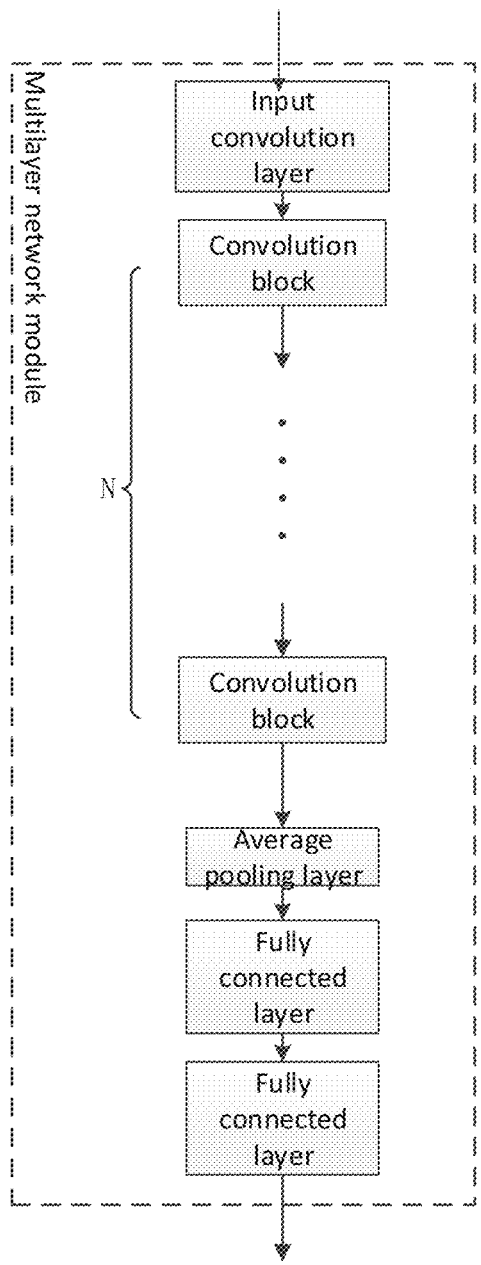
FIG. 4 is a schematic structural diagram of a multi-layer network module I in another embodiment of the present invention.
Figure 4A:
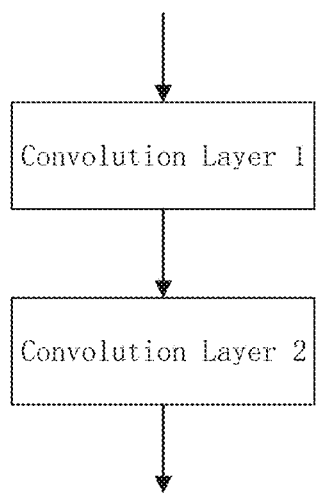
FIGS. 4a-4c are schematic structural diagrams of a convolution block of the present invention according to the present invention.
Figure 4B:
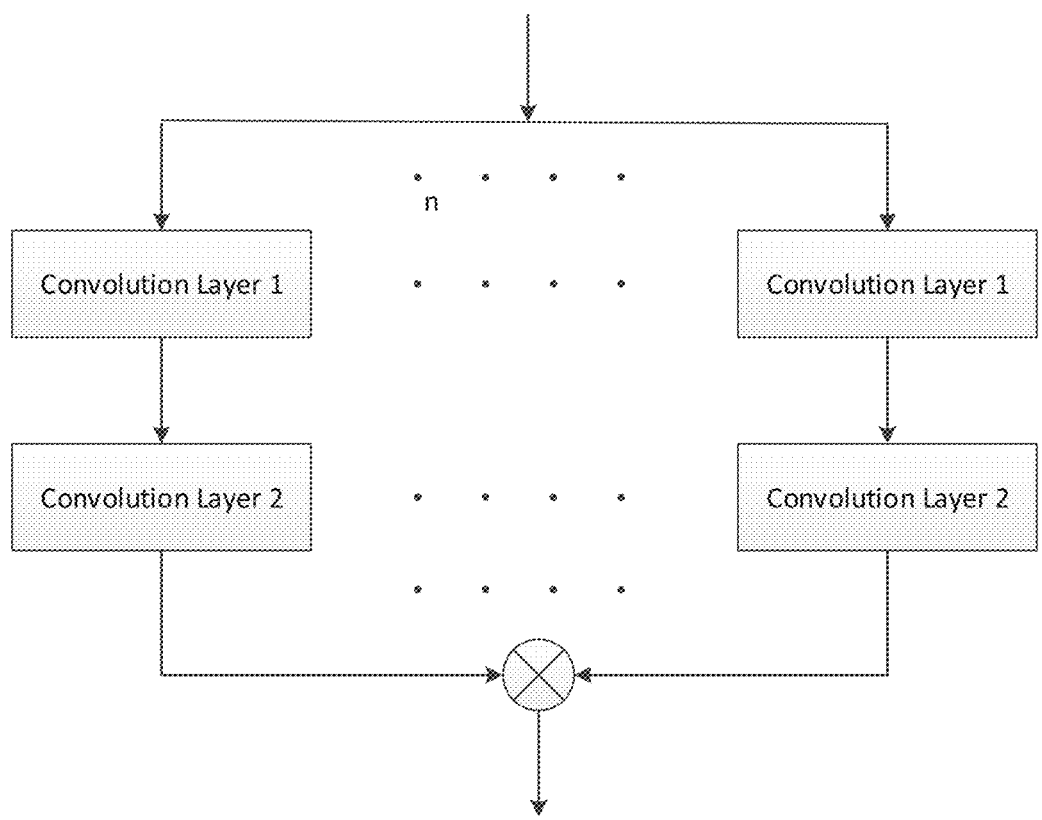
Figure 4C:
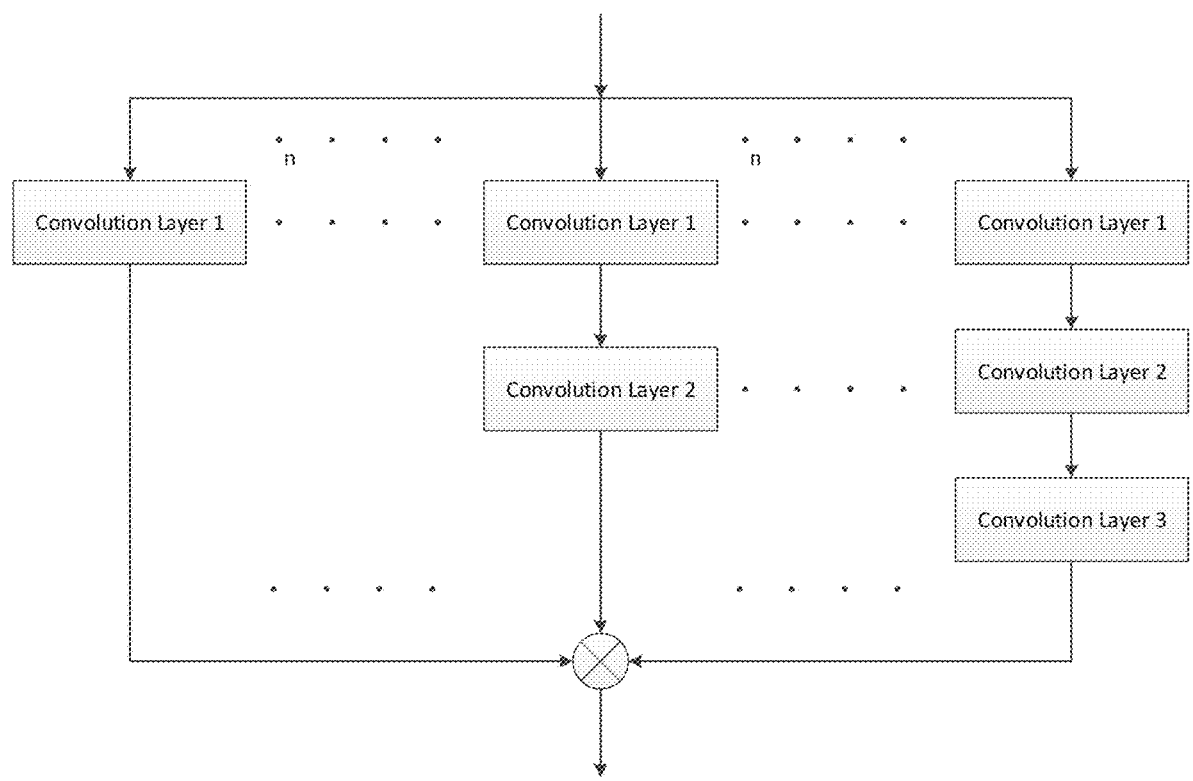

FIG. 4 shows a multi-layer network module 1 according to another embodiment of the present invention. The multi-layer network module 1 includes a packet input convolution layer, a convolution block, an average pooling layer, and two full-connection layers. As shown in FIGS. 4a to 4b, the specific structure of the convolution block of the present invention is shown in FIG. 4a, which is a two-layer convolution structure formed by stacking two convolution layers. A multi-channel structure is shown in FIG. 4b, and each channel has two convolution layers stacked. Another multi-channel structure is shown in FIG. 4c, with each channel consisting of 1 to 3 convolution layers. The relevant parameters of the convolution kernel in the convolution block and the number of channels, or the number of convolution layers per channel, can all be obtained by hyperparametric machine training. The convolution operation involved in the convolution layer in the present invention employs a convolution operation method known in the prior art. But the number of convolution layer layers in the multilayer network module of the present invention, the convolution kernel and related parameters are determined by the model training method of the present invention to obtain an optimized deep neural network location identification model.

Figure 5:
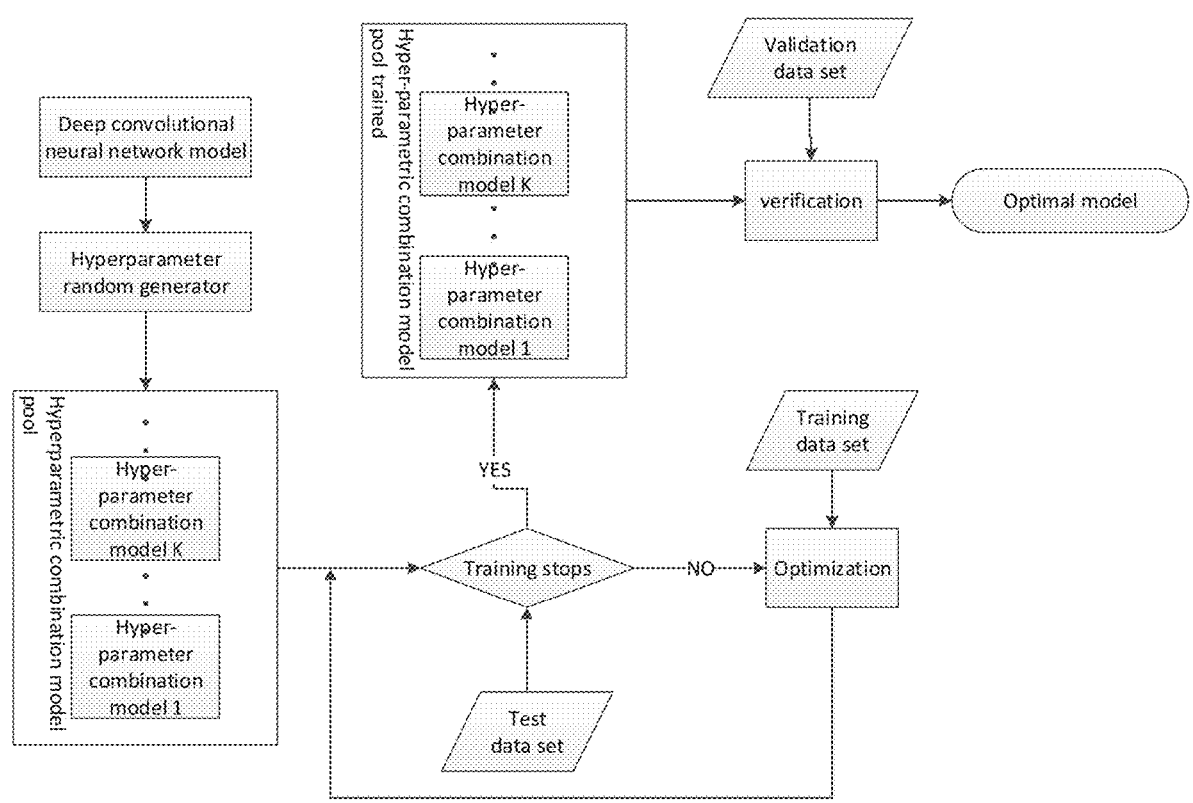
FIG. 5 is a hyperparametric machine training flow diagram of the present invention.

Machine Training to Optimize Deep Neural Network Positioning and Identification Model FIG. 5 shows a hyperparametric machine training flowchart according to the present invention. The purpose of the hyperparametric machine training is to obtain the above-mentioned deep neural network location and recognition parameters by training according to the provided training data set, verification data set, and test data set, and to obtain an optimal hyperparameter combination model of the deep neural network location and recognition model. The machine training process is as follows:

a. Enter the hyperparameter random generator into the deep neural network location and recognition model structure;

b. Construct a hyperparametric combinatorial model pool from the hyperparameter random generator;

c. Use the test data set to test each hyperparameter combination model in the hyperparameter combination model pool. If the test passes, then end the training and input the hyper parameter combination model into the trained hyperparameter combination model pool. If the test fails, then optimize the hyperparameter combinatorial model by using the training data set, and to rerun the testing and optimizing routine again until the model test passes.

d. Validate each hyperparametric combinatorial model in the pool of hyperparametric combinatorial models using the validated data set. The validated hyperparametric combinatorial model is the optimal hyperparametric combinatorial model.

There are two types of data used in the training dataset, verification dataset, and test dataset used in the hyperparametric machine training process, namely the waveform data before the fault point and the waveform data after the fault point. Each type of data takes no less than 40,000 data packets with a total of no less than 80,000 packets. Each of these data contains no more than 5 sets of data. Each set of data contains one high frequency component data and one low frequency component data. Training datasets use no less than 36,000 packets of each type, and test and verification datasets use no less than 2000 packets of each type. The optimization method in the training process is batch Adam backward transmission. When the accuracy of the test data set is greater than 99% or the training exceeds 10,000 rounds, the training stops. Otherwise, the optimization is continued. The highest accuracy rate of matching the verification data set from these multiple hyperparameter combination model will be the criteria for choosing the optimal hyperparameter combination model.

In the present invention, migration training can also be used to implement training of the model, and the migration learning method is used to train a single-group data block deep neural network model having only one set of high frequency component data and low frequency component data input, With training results that derive at an optimal model, extract the convolutional structure and parameters. Then further use the structure and parameters of the convolutional layer to initialize the deep neural network model for input of multiple sets of data blocks. After the deep neural network model of data block input is initialized for multi-set data block machine training, to finally obtain an optimized deep neural network model based on multiple sets of data block inputs.

Compared with the prior art, one or more embodiments of the present invention may have the following advantages:

1. The deep neural network of the present invention forms an end-to-end fault location identification and decision process, which improves the accuracy of neural network fault location and identification.

2. By constructing a time-correlated multi-channel deep neural network, the effective information from long-term span waveforms used to detect the fault evolution process or intermittent fault determination is saved, thereby improving the accuracy of fault location and identification.

Additional features and advantages of the invention will be set forth in the description follows, or in part will be obvious from the description, or will be made clear by practice of the invention. The objectives and other advantages of the invention will be realized and attained by the structure particularly pointed out in the written description and claims hereof as well as the drawings.

Embodiment One

Figure 6:
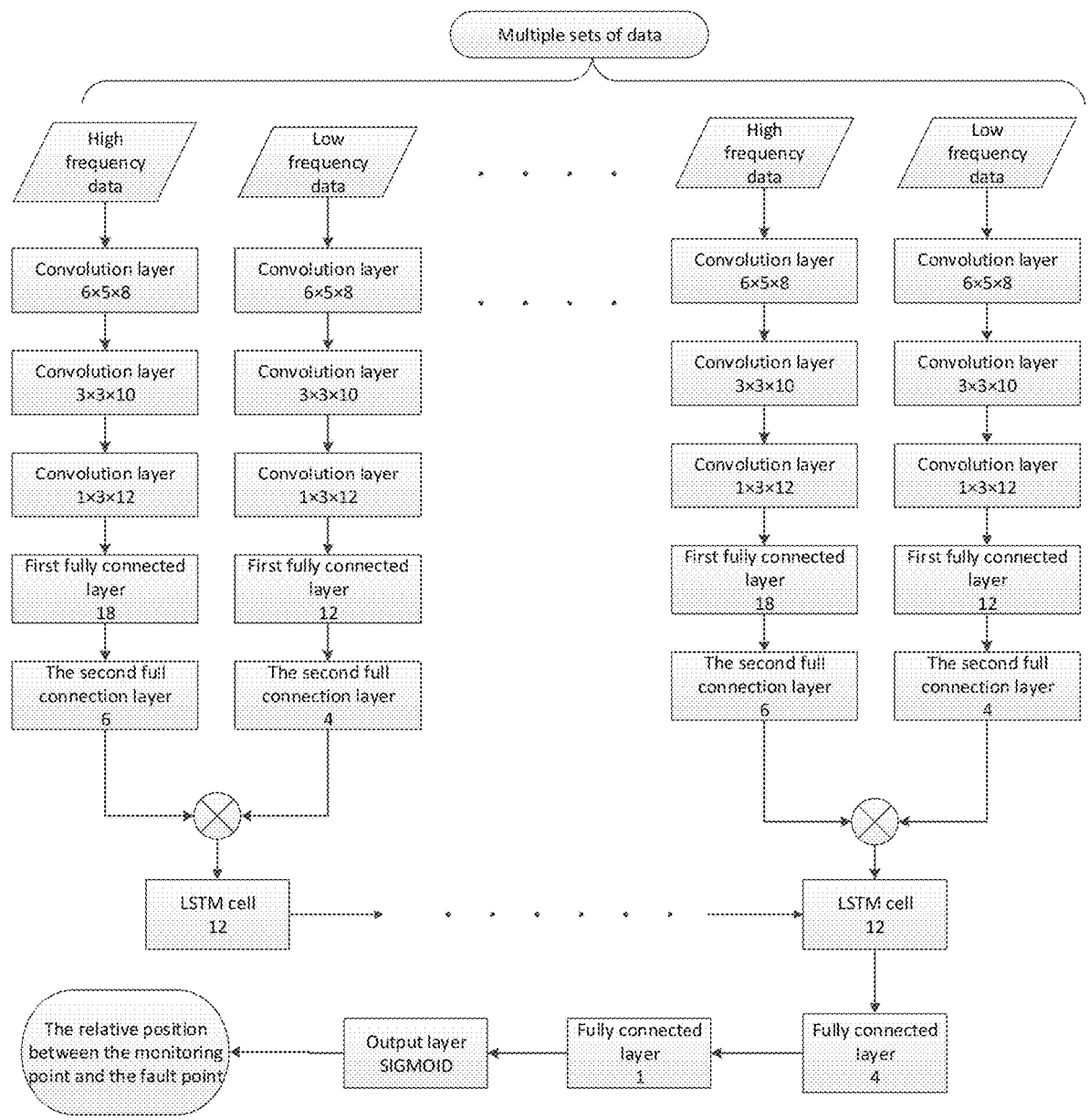
FIG. 6 is a schematic diagram of an optimal depth neural network location and recognition model according to an embodiment of the present invention.

FIG. 6 is a schematic diagram of an optimal deep neural network location and recognition model in the present invention. The method will be described below with reference to FIG. 6.

First of all, according to the wide-area time synchronization technology, the data collection point of each monitoring point is aligned and the common section of the waveform is cut out, and then the network topological relations of different distribution network monitoring points are spliced in sequence to form a complete synchronization data of each monitoring point.

Subsequently, high-frequency component data and low-frequency component data of synchronization data of each monitoring point are extracted through waveform preprocessing.

In this embodiment, the models of the multi-layer network modules I and II are used. The machine training of the model is performed by using the machine training method shown in FIG. 5. The training data set, verification data set, and the data used in the hyperparametric machine training process are two types of data, namely the waveform data before the fault point and the waveform data after the fault point. Each type of data is comprised of 40000 packets, for a total of 80,000 packets. Each of these data packets contains five sets of data. Each set of data contains one high frequency component data and one low frequency component data. The training data set uses 36,000 packets of each type, and the test and verification data sets use 2,000 packets of each type. The optimization method in the training process is batch Adam backward transmission. When the accuracy of the test data set is greater than 99% or the training exceeds 10,000 rounds, the training stops. Otherwise, the optimization is continued. The highest accuracy rate of matching the verification data set from these multiple hyperparameter combination model will be the criteria for choosing the optimal hyperparameter combination model.

Figure 7:
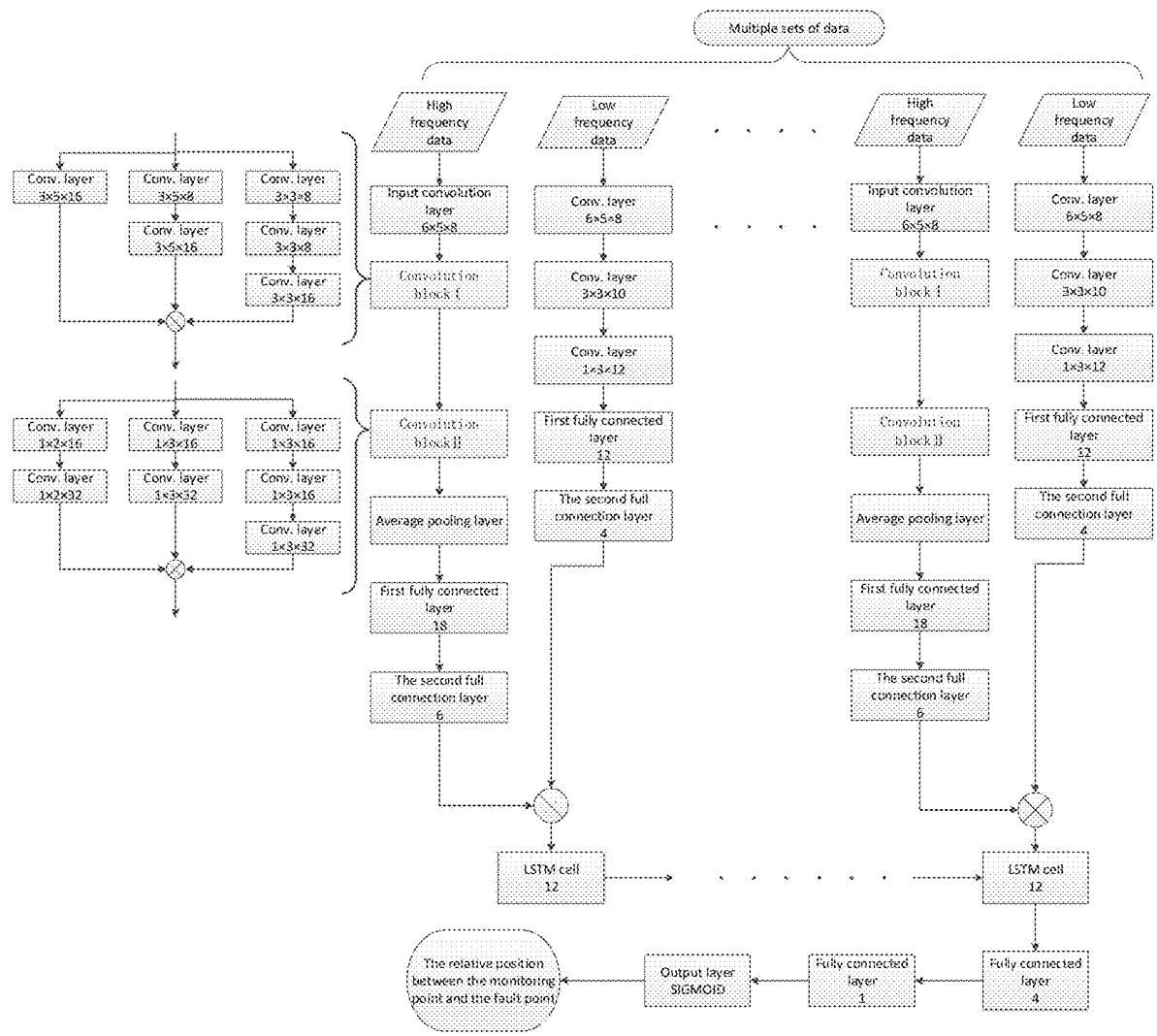
FIG. 7 is a schematic diagram of an optimal deep neural network location and identification model according to another embodiment of the present invention.

The obtained optimal hyperparameter combination model is shown in FIG. 7. The convolution layer in the multi-layer network modules I and II is set to have three layers. The width and length of the convolution kernel of the first layer convolution layer is 6×5, and the number of kernel is 8. The width and length of the convolution kernel of the second convolution layer is 3×3, and the number kernel is 10. The width and length of the convolution kernel of the third convolution layer is 1×3, and the number of kernel is 12. The number of neurons in the two fully connected layers is 12 in the first fully connected layer and 4 in the second fully connected layer. The number of features of the LSTM cell is set to be twelve. The number of neurons connected to the full-connection layer after the network elements are 4 and 1 respectively.

By inputting waveform data containing multiple sets of high-frequency component data and low-frequency component data at each monitoring point into the optimal hyperparameter combination model, the relative position information between each monitoring point and the fault point can be obtained, thereby realizing identification of the fault location.

Embodiment Two

FIG. 7 is a schematic diagram of an optimal depth neural network location and recognition model of another embodiment of the present invention. The method will be described below with reference to FIG. 7.

Similar to the first embodiment, first, according to the wide-area time synchronization technology, the acquisition points of the data of each monitoring point are aligned and the common sections of the waveform are cut out. Then the network topology relationships of different distribution network monitoring points are sequentially connected, forming a complete synchronization data set for each monitoring point.

Subsequently, high-frequency component data and low-frequency component data of synchronization data of each monitoring point are extracted through waveform preprocessing.

In this embodiment, the multi-layer network module I adopts the structure shown in FIG. 4, and the multi-layer network module II still uses the structure shown in FIG. 3. Using the machine training method shown in FIG. 5, machine training is performed on the model. The training data set, verification data set, and test data collection used during the hyperparametric machine training process have two types of data, namely, the waveform data before the fault point and waveform data after the point of failure. Each type of data takes 60,000 packets for a total of 120,000 packets. Each of these data packets contains 8 sets of data. Each set of data contains one high frequency component data and one low frequency component data. The training dataset uses 40,000 data packets of each type, and the test and verification dataset uses 10,000 data packets of each type. The optimization method in the training process is batch Adam backward transmission. When the accuracy of the test data set is greater than 99% or the training exceeds 10,000 rounds, the training is stopped. Otherwise, the optimization is continued. The highest accuracy rate of matching the verification data set from these multiple hyperparameter combination model will be the criteria for choosing the optimal hyperparameter combination model.

The obtained optimal hyperparameter combination model is shown in FIG. 7. The width and length of the convolution kernel of the input convolution layer in the multi-layer network module I are 6×5, and the number of kernel is 8. The number of convolution blocks is two, in which the convolution block I is set to have a three-channel convolution layer. Each channel a is a single-layer convolution layer, and the convolution kernel has a width and length of 3×5, and the number of kernel is 16. Channel b is a double convolutional layer. The width and length of the convolution kernel of the first convolutional layer are 3×5, and the number of kernel is 8. The width and length of the convolution kernel of the second convolutional layer are 3×5, and the number of kernel is 16. Channel c is a three-layer convolutional layer. The width and length of the convolution kernel of the first convolution layer are 3×3, and the number of kernel is 8. The width and length of the convolution kernel of the second convolution layer are also 3×3, and the number of kernel is also 8. The width and length of the convolution kernels of the third convolutional layer are 4×3, and the number of kernel is 16. The convolution block II is set as a convolution layer having three channels. Channel a of which is a double convolution layer, wherein the width and length of the convolution kernel of the first convolution layer are 1×2, the number kernel is 16. The width and length of the convolution kernel of the second convolution layer are 1×2 and the number of kernel is 32. Channel b is a double convolutional layer. The width and length of the convolution kernel of the first convolution layer are 1×3, and the number of kernel is 16. The width and length of the convolution kernel of the second convolution layer are 1×3, and the number kernel is 32. Channel c is a three-layer convolution layer. The convolution kernel of the first convolution layer has a width and length of 1×3, and the number kernel is 16. The width and length of the convolution kernel of the second convolution layer are 1×3 and the number of kernel is 16. The width and length of the convolution kernels of the third convolutional layer are 1×3, and the number kernel is 32.

The convolution layer in the multi-layer network module II is set to three layers. The width and length of the convolution kernel of the first convolution layer are 6×5, and the number of kernel is 8. The convolution kernel of the second convolution layer has width and length of 3×3, and the number kernel is 10. The width and length of the convolution kernel of the third convolutional layer are 1×3, and the number of kernel is 12. The number of neurons in the two fully connected layers is 12 in the first fully connected layer and 4 in the second fully connected layer. The number of features of the LSTM cell is set to be twelve. The number of neurons connected to the full-connection layer are 4 and 1 respectively, after the network elements are stored for a period of time.

By inputting waveform data containing multiple sets of high-frequency component data and low-frequency component data at each monitoring point into the optimal hyperparameter combination model, the relative position information between each monitoring point and the fault point can be obtained, thereby realizing the identification of the fault location.

The invention claimed is:

1. An electrical system for fault location in a distribution network having monitoring devices, with at least one device configured to:
    determine common electrical waveform for each monitoring point based on wide area synchronization devices; based on the common electrical waveform, sequentially piece together the waveform over the monitoring points as synchronized data;
    preprocess the synchronized data from each monitoring point into high frequency component sequence and low frequency component sequence;
    construct deep neural network circuitry model to include the multi-convolution layer, long and short term memory network unit groups of data block input; and further through machine training, obtain plurality of data block input deep neural network models; and finally choose an optimal model;
    thereafter, feed into this optimal model electrical waveform data from the monitoring points, which includes the high frequency component sequence and the low frequency component sequence, to obtain relative positioning relationship between each monitoring point and the fault location;
    wherein the deep neural network model is a multi-component data block input deep neural network model contains high frequency and low frequency data block input; and wherein the high frequency data block is input into multi-layer network Module I, and the low frequency data block is input into multi-layer network Module II;
    wherein the multi-layer network Module I includes multi-convolution layers and a full connection layer between convolutions layers; and wherein the multi-layer network Module II includes multi-convolution layers and a full connection layer between convolutions layers;
    wherein the multi-layer network Module I further includes a convolution block, and an average pooling layer;
    wherein the multi-layer network Module I output is superimposed with the output from the multi-layer network Module II based on weight factor, before being input into a shared Long and Short Term Memory (LSTM) cell, where the timing sequence is used to connect between the multiple LSTM cells through multiple computation channels.

2. The fault location system according to claim 1 wherein the number of convolution layers in the multi-layer network module I, convolution kernel and related parameters are determined by model training method to obtain an optimized deep neural network location identification model.

3. The fault location system according to claim 2, wherein the convolution block is a two-layer convolution structure formed by stacking the two convolution layers.

4. The fault location system according to claim 3, wherein the computation channels consisting of 1 to 3 convolution layers are formed by having 1 convolution layer or by stacking 2 to 3 convolution layers.

5. The fault location system according to claim 4, wherein the relevant parameters of convolution kernel in the convolution block and the number of channels, or the number of convolution layers per channel, are obtained by hyperparametric machine training.

6. The fault location system according to claim 5, wherein a plurality of effective waveform sections having an abnormal section in the current or electromagnetic field that includes frequency components other than the operating frequency.

7. The fault location system according to claim 6, wherein the high-frequency components and low-frequency components arranged in time sequence are obtained from the plurality of effective waveform sections.

8. The fault location system according to claim 7, wherein the high-frequency components and low-frequency components would be used to measure how close the monitoring point is relative to the effective waveform sections area according to degree of waveform anomaly.

* * * * *